United States Patent
Stevens et al.

(10) Patent No.: US 6,838,683 B1
(45) Date of Patent: Jan. 4, 2005

(54) FOCUSED ION BEAM MICROLATHE

(75) Inventors: Mary B. Stevens, Sacramento, CA (US); Peter Zwigl, Citrus Heights, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/465,776

(22) Filed: Jun. 18, 2003

(51) Int. Cl.$^7$ .............................. G21G 5/00
(52) U.S. Cl. ...................... 250/492.1; 250/492.3
(58) Field of Search .................... 250/492.1, 492.3

(56) References Cited

U.S. PATENT DOCUMENTS 6,017,590 A * 1/2000 Lindsay et al. .......... 427/430.1
6,303,932 B1 * 10/2001 Hamamura et al. ......... 250/309
6,452,174 B1 * 9/2002 Hirose et al. .............. 250/309
2002/0050565 A1 * 5/2002 Tokuda et al. ............. 250/310

OTHER PUBLICATIONS

IBM, "Focused Ion Beam Technology," doc.asweb13.fm.00, Oct. 25, 2002, pp. 1–4, can be accessed at http://www-3.ibm.com/chips/techlib/techlib.nsf/techdocs/.
Fibics, Inc. "Introduction: Focused Ion Beam Systems," 2003, 1 page, can be accessed at http://www.fibics.com/FIBBasics.html.

* cited by examiner

*Primary Examiner*—John R. Lee
*Assistant Examiner*—Kalimah Fernandez
(74) *Attorney, Agent, or Firm*—Blakely, Sokoloff, Taylor & Zafman LLP

(57) ABSTRACT

An apparatus for customizing focused ion beam (FIB) probes is described. Prior to taking probe measurements, the probe tips are milled with a beam of gallium ions on a microlathe platform. A motor rotates the probes such that the probe tips are uniformly milled.

18 Claims, 3 Drawing Sheets

FOCUSED ION BEAM MICROLATHE

FIELD OF THE INVENTION

The present invention pertains to the field of microelectronic device testing. More particularly, the present invention relates to an apparatus that reduces the tip diameter and profile size of commercially available focused ion beam probes.

BACKGROUND OF THE INVENTION

Focused ion beam (FIB) technology is often used to make precision circuit modifications in microelectronics. The FIB typically utilizes a controlled beam of ions to drill holes through passivation layers and to cut metal lines. In addition, the FIB has been used to deposit metal and insulators.

A prober is often used to measure electric characteristics of components of microelectronic chips. The probe is typically made of tungsten and shaped like a spear. The pointed end of the probe (the probe tip) may be 100 nanometers or less. Measurements of the chip are taken by establishing a contact between a probe tip and on-chip metal lines. A plurality of probes are usually coupled to the prober. Each probe is coupled to a shaft that is positioned over the chip surface.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In order to decrease chip dimensions and to reduce costs, the trend in microelectronic design is towards smaller devices and thinner metal lines. As the width of metal lines continue to shrink, probe tip radii provided by manufacturers are becoming too large to provide accurate measurements. For example, probe tips are often too wide to allow precise positioning of the tips on metal lines. This is especially a problem when multiple probes are used to measure metal lines in close vicinity to one another. In addition, the exact position of the probe tip that is used to contact the metal line is often uncertain because the view of the metal line is obstructed by the tip itself.

Figure 1:
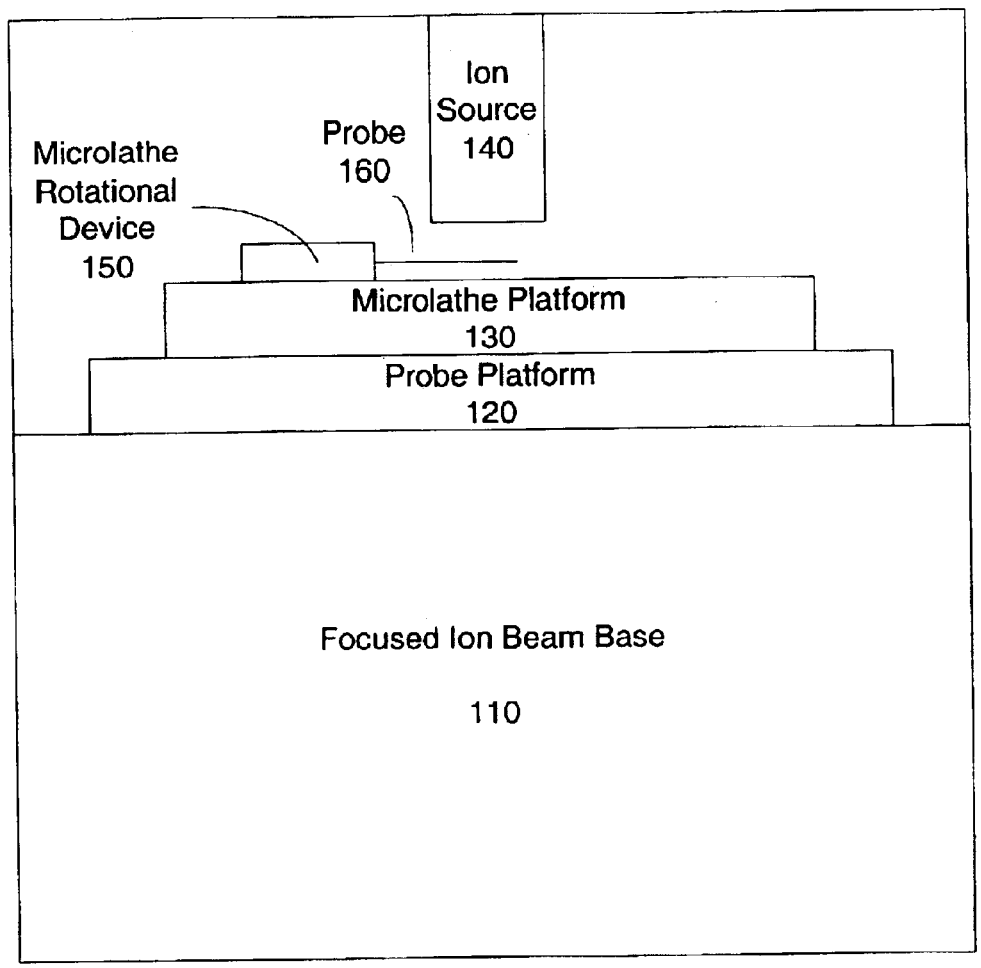
FIG. 1 is a side view of an embodiment of a focused ion beam system that mills probe tips.

FIG. 1 shows a FIB system that allows the probe or just the probe tip to be milled prior to probing. The system comprises a FIB base 110 coupled to a probe platform 120. A microelectronic sample is typically placed on the probe platform 120 to take measurements of the sample. A microlathe platform 130 is coupled to the probe platform 120. A microlathe rotational device 150 is coupled to the microlathe platform 130. A probe 160 is coupled to the microlathe rotational device 150. The probe 160 may be composed of tungsten. An ion source 140 generates an ion beam for the system.

A beam of Gallium (Ga) ions may be focused on the probe 160. The tip of the probe 160 is positioned below the ion source 140 by the microlathe rotational device 150 and the microlathe platform 130. The ion beam for milling the tip of probe 160 may be more intense than the ion beam used to make modifications to a microelectronic sample. For one embodiment of the invention, the ion beam for probe tip milling is approximately 500–1000 picoamperes.

During probe tip milling, the microlathe rotational device 150 rotates the probe 160 such that the ion beam is uniformly applied to the periphery of the probe tip. Milling the probe tip using ion beams allows the user to customize the dimensions of the tip of probe 160. By reducing the width of the probe tip, more precise positioning of the tip on a metal line of a microelectronic chip may be achieved. Moreover, reducing the width of the probe tip allows for the position of the tip to be more readily attained.

The ion beam also helps to remove oxidation that may build up on the probe tip. Removing oxidation helps to provide for a better contact between the probe and metal lines. In addition, a thinner probe tip may help to reduce cross talk. When multiple probe tips are used to take measurements from adjacent metal lines on a chip, the signals measured by the probe tips may generate cross talk. Reducing the width of probe tips may reduce cross talk by allowing more separation between probe tips during measurements.

After probe tip milling is complete, the microlathe platform 130 and the microlathe rotational device 150 are removed from the probe platform 120. A microelectronic sample is then mounted to the probe platform 120 to modify or take measurements of the sample. The focused ion beam base 110 may comprise a microscope and an apparatus for recording images.

For another embodiment of the invention, an atomic force microscopy (AFM) probe, a microelectromechanical system (MEMS) device, a stylus, or a micromanipulator may be coupled to the rotational device 150 for milling.

Figure 2:
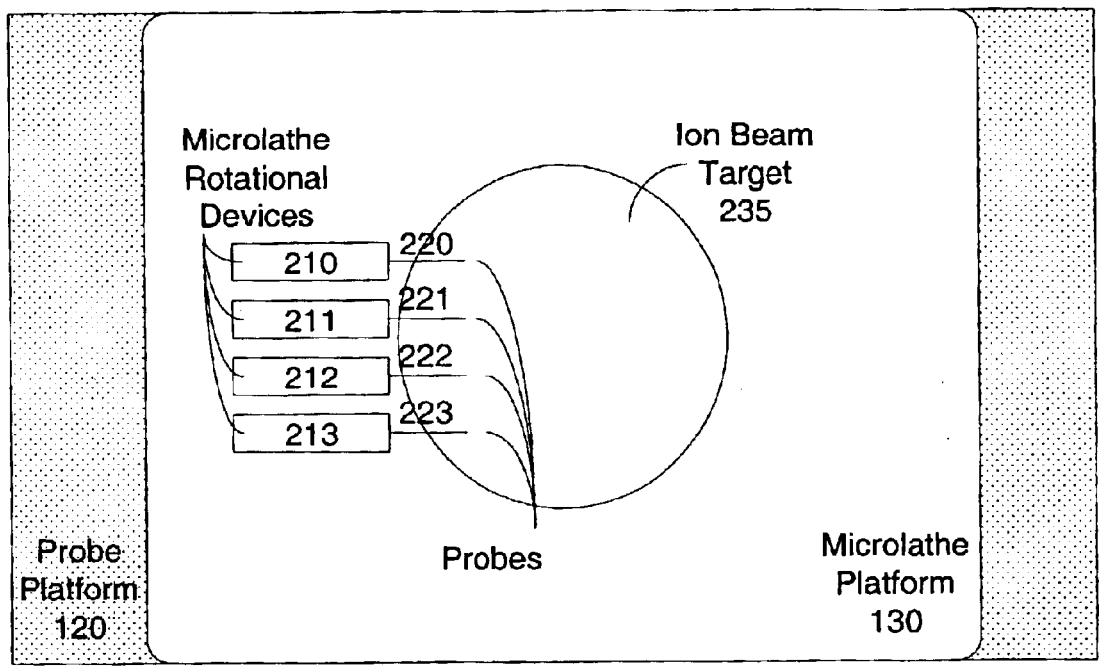
FIG. 2 is a top view of an embodiment of a focused ion beam system that mills probe tips.
Figure 3:
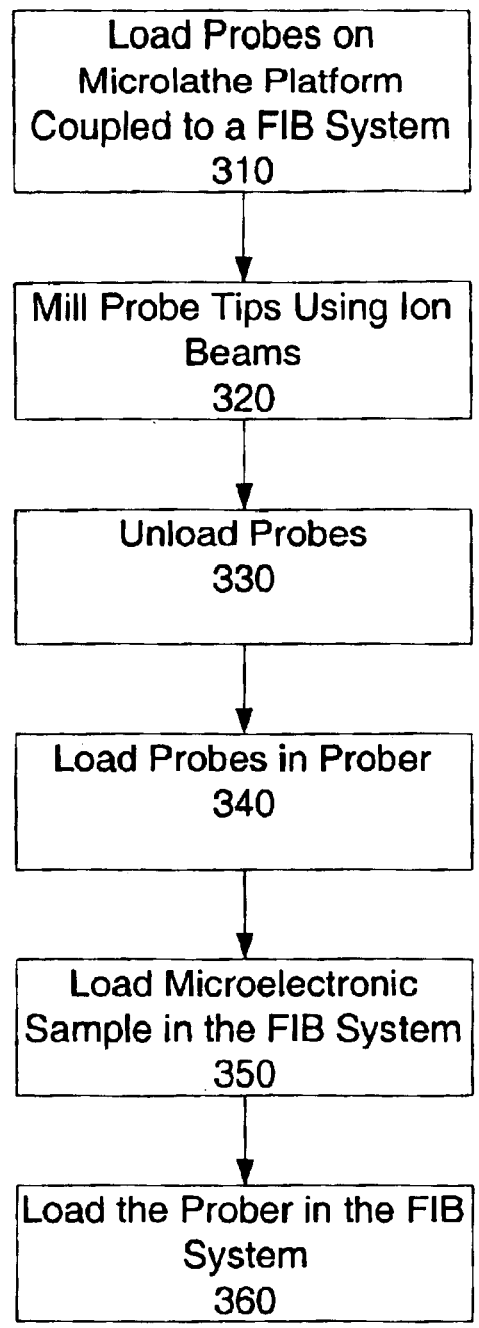
FIG. 3 is a flowchart of a process for milling probe tips using a modified focused ion beam system.

For yet another embodiment of the invention, the FIB system may comprise a plurality of rotational devices for milling probes. FIG. 2 shows an overhead view of a FIB system for milling probes. Microlathe platform 130 is coupled to probe platform 120. The microlathe platform 130 has an orifice that is the approximate location of the ion beam target 235. Microlathe rotational devices 210, 211, 212, and 213 are coupled to the microlathe platform 130. Probe 220 is coupled to the microlathe rotational device 210. Probe 221 is coupled to the microlathe rotational device 211. Probe 222 is coupled to the microlathe rotational device 212. Probe 223 is coupled to the microlathe rotational device 213.

An ion beam is directed at the ion beam target 235. The microlathe rotational devices 210–214 may each comprise a motor. The rotational devices 210–214 rotate the probes 220–224 at approximately the same time that the ion beam is milling the probes 220–224. The milling duration will depend on the speed that the rotational devices 210–214 rotate the probes 220–224, the amount of removal desired from the probes 220–224, and the magnitude of the ion beam.

Even though FIG. 2 depicts four microlathe rotational devices coupled to the microlathe platform 130, more than four microlathe rotational devices may be coupled to the microlathe platform 130. For example, a dozen microlathe rotational devices may be coupled to the microlathe platform 130 around the ion beam target 235 such that 12 probes may be milled at approximately the same time. The microlathe rotational devices may be distributed around the ion beam target 235 or the devices may be coupled to the microlathe platform 130 in columns or rows.

FIG. 4 shows a flowchart of a process for milling probes using a modified FIB system. The probes are loaded on a microlathe platform in operation 310. The microlathe platform is coupled to a FIB system. The probes are milled in operation 320 using a beam of ions. The probes are rotated to help ensure uniform milling of each probe surface. The probes are unloaded from the microlathe platform in operation 330 after milling is complete. The microlathe platform may also be removed from the FIB system.

The probes are then loaded in the prober in operation 340. The microelectronic sample is loaded in the FIB system in operation 350. Finally, the prober is loaded in the FIB system in operation 360.

For embodiment of the invention, the probes are loaded on a microlathe platform in operation 310. The probes are milled in operation 320 using a beam of ions. The probes are unloaded from the microlathe platform in operation 330 after milling is complete. The probes are then loaded in the prober in operation 340. The prober is mounted in the FIB system in operation 350. The sampled is then loaded in operation 360.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A focused ion beam (FIB) system, comprising:
   a probe platform that mounts a microelectronic chip sample to be modified on the FIB system;
   a focused ion beam base coupled to the probe platform, wherein the focused ion beam base comprises circuitry to store photographic images of the microelectronic chip sample; and
   a microlathe platform coupled to the probe platform, wherein the microlathe platform is coupled to a first microlathe rotational device that is positioned on the microlathe platform to position a first probe to come into contact with a beam of ions, wherein the beam of ions mills the tip of the first probe.

2. The FIB system of claim 1, wherein the first microlathe rotational device rotates the first probe as the beam of ions mills the first probe tip.

3. The FIB system of claim 1, wherein the beam of ions is approximately 500–1000 picoamperes.

4. The FIB system of claim 3, further comprising:
   a second microlathe rotational device coupled to the microlathe platform, wherein the second microlathe rotational device positions a second probe to sharpen the tip of the second probe by the beam of ions.

5. The FIB system of claim 1, wherein the microlathe platform is removed from the probe platform prior to mounting a chip sample to the probe platform.

6. The FIB system of claim 1, further comprising:
   a microelectromechanical system (MEMS) device coupled to the first microlathe rotational device that positions the MEMS device to come into contact with a beam of ions, wherein the beam of ions mills the MEMS device.

7. The FIB system of claim 1, further comprising:
   a micromanipulator coupled to the first microlathe rotational device that positions the micromanipulator to come into contact with a beam of ions, wherein the beam of ions mills the micromanipulator.

8. A system, comprising:
   an ion source that generates a gallium ion beam;
   a plurality of tungsten probes positioned to be in contact with the ion beam, wherein each of the plurality of probes is coupled to a device that rotates the probes, wherein the gallium ion beam reduces the surface area of the tips of each of the plurality of probes; and
   a platform for coupling a microelectronic sample to the system, wherein the ion beam modifies a circuit of the sample.

9. The system of claim 8, wherein the intensity of the ion beam for reducing the surface area of the tips of the plurality of probes is greater than the intensity of the ion beam for modifying the sample.

10. An apparatus, comprising:
    means for improving positioning of a probe tip on a metal line; and
    means for removing oxidation from the probe tip.

11. The apparatus of claim 10, further comprising:
    means for reducing cross talk of signals measured by the probe tip.

12. A method, comprising:
    loading m probes on a microlathe platform that is coupled to a focused ion beam (FIB) system, wherein m is an integer greater than or equal to one; and
    rotating the m probes and milling the m probes using an ion beam.

13. The method of claim 12, wherein the ion beam is 500–1000 picamperes.

14. The method of claim 12, wherein the milling duration is a function of the rotation speed of the m probes.

15. The method of claim 12, further comprising:
    unloading the m probes and the microlathe platform from the FIB system.

16. The method of claim 15, further comprising:
    loading n probes in a prober, wherein n is an integer less than or equal to m.

17. The method of claim 16, further comprising:
    loading a microelectronic sample in the FIB system; and
    loading the prober in the FIB system.

18. The method of claim 17, further comprising:
    making modifications to the microelectronic sample; and
    taking measurements of the microelectronic sample using the prober.

* * * * *